US006919163B2

(12) United States Patent
Oohashi et al.

(10) Patent No.: US 6,919,163 B2
(45) Date of Patent: Jul. 19, 2005

(54) LITHOGRAPHIC PRINTING PLATE PRECURSOR

(75) Inventors: Hidekazu Oohashi, Shizuoka (JP); Sumiaki Yamasaki, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 44 days.

(21) Appl. No.: 10/346,083

(22) Filed: Jan. 17, 2003

(65) Prior Publication Data

US 2003/0186057 A1 Oct. 2, 2003

(30) Foreign Application Priority Data

Jan. 18, 2002 (JP) ....................................... P.2002-10311

(51) Int. Cl.[7] ............................. G03C 1/76; G03F 7/26; B41N 1/00

(52) U.S. Cl. ................. 430/273.1; 430/302; 430/270.1; 430/271.1; 430/964; 101/450.1; 101/453; 101/457; 101/467

(58) Field of Search ........................... 430/270.1, 271.1, 430/964, 273.1, 302; 101/453, 450.1, 457, 467

(56) References Cited

U.S. PATENT DOCUMENTS

| | | | | |
|---|---|---|---|---|
| 5,569,573 A | * | 10/1996 | Takahashi et al. | 430/138 |
| 6,391,516 B1 | * | 5/2002 | Vermeersch et al. | 430/270.1 |
| 6,637,334 B2 | * | 10/2003 | Akiyama et al. | 101/457 |
| 6,653,042 B1 | * | 11/2003 | Fukino et al. | 430/270.1 |
| 2001/0036592 A1 | * | 11/2001 | Hoshi et al. | 430/270.1 |

FOREIGN PATENT DOCUMENTS

| | | |
|---|---|---|
| EP | 0 903 224 A2 | 3/1999 |
| EP | 0 938 972 A1 | 9/1999 |
| EP | 0 949 088 A1 | 10/1999 |
| EP | 0 770 494 B1 | 5/2000 |
| EP | 1 226 976 A1 | 7/2002 |
| EP | 1 266 767 A2 | 12/2002 |
| JP | 2001-315452 A | 11/2001 |
| JP | 2002-226597 | 8/2002 |
| WO | WO 94/23954 | 10/1994 |

* cited by examiner

*Primary Examiner*—Jeffrey B. Robertson
(74) *Attorney, Agent, or Firm*—Burns, Doane, Swecker & Mathis, L.L.P.

(57) ABSTRACT

A lithographic printing plate precursor comprising a support having provided thereon a hydrophilic layer which is converted to hydrophobic by heating, wherein the hydrophilic layer contains (1) an organic and inorganic composite having a crosslinking structure obtained by hydrolysis and poly-condensation on condition of coexistence of a metal complex compound and an organic hydrophilic resin, and (2) core-shell structural fine particles containing a resin core having a functional group capable of interacting with the organic and inorganic composite and a resin shell not substantially having a functional group capable of interacting with the organic and inorganic composite.

3 Claims, No Drawings

LITHOGRAPHIC PRINTING PLATE PRECURSOR

FIELD OF THE INVENTION

The present invention relates to a lithographic printing plate precursor comprising a support having provided thereon a hydrophilic layer capable of image-forming, on which images can be recorded by scanning exposure based on digital signals and the recorded images can be mounted on a press without development processing for printing.

BACKGROUND OF THE INVENTION

A lithographic printing plate generally comprises a hydrophobic (lipophilic) image area which repels a fountain solution and receives ink and a hydrophilic non-image-area which receives a fountain solution in printing process. Such a lithographic printing plate is generally produced by mask-exposing a PS plate comprising a hydrophilic support having provided thereon a lipophilic photosensitive resin layer through a lith film and dissolving and removing the photosensitive resin layer of a non-image area with a developing solution.

Digitized techniques of electronically processing, accumulating and outputting image data with a computer have prevailed in recent years, as a result, computer to plate (CTP) techniques capable of directly making an image on a printing plate precursor by scanning highly directional rays such as laser rays in accordance with digitized image data without using a lith film have been developed.

Of such techniques, lithographic printing plate precursors requiring no development which can be used for printing as they are by mounting on a press without development processing after exposure have also been studied for further rationalization of processing and solving the problem of waste solutions. For example, various CTP printing plates requiring no development are described in Bulletin of Printing Institute of Japan, Vol. 36, pp. 148 to 163 (1999).

As one promising method, there is a method of using a heat-sensitive lithographic printing plate precursor having a hydrophilic layer (an image-forming layer) comprising hydrophobic polymer fine particles dispersed in a matrix such as a crosslinked hydrophilic resin and the like. That is, the hydrophobic polymer fine particles are melted and coalesce when heat is applied to the hydrophilic layer, and the heated part of the hydrophilic layer is converted to a hydrophobic image. It is known that a printing plate having the surface consisting of such a hydrophobic image area and a hydrophilic layer part not to be heated (a non-image area) requires no treatment such as liquid development, and can be used as a lithographic printing plate using a fountain solution with no treatment.

It is also known that a heat-sensitive lithographic printing plate precursor using microcapsules encapsulating a hydrophobic substance in place of the hydrophobic polymer fine particles can also be used as a lithographic printing plate using a fountain solution with no treatment. In this case, when heat is applied to the hydrophilic layer, the microcapsules are ruptured and the encapsulated hydrophobic substance oozes out and the hydrophilic layer is converted to a hydrophobic image area.

For instance, heat-sensitive lithographic printing plate precursors comprising a support having provided thereon a hydrophilic layer comprising a matrix obtained by crosslinking a hydrophilic binder, e.g., polyvinyl alcohol, with hydrolyzed tetraalkyl orthosilicate containing thermoplastic polymer fine particles are described in *Research Disclosure*, No. 33303 (January, 1992), and Japanese Patent 2938397.

Japanese Patent (Application) Laid-Open Nos. 1849/1995, 6468/1998 and 70756/1999 disclose heat-sensitive lithographic printing plate precursors having a hydrophilic layer comprising a crosslinked hydrophilic binder polymer having dispersed therein microcapsules encapsulating a lipophilic component, and the above patents disclose that these heat-sensitive lithographic printing plate precursors can be used for printing with no treatment after the application of heat.

Japanese Patent Laid-Open Nos. 226597/2002 discloses a heat-sensitive lithographic printing plate containing hydrophobic polymer fine particles covered with inorganic fine particles in hydrolyzed tetraalkyl orthosilicate.

However, the hydrophilic property and press life of the hydrophilic layer are insufficient in these conventional techniques, and thereby a problem that the scumming is gradually generated in a non-image area when the printing is continued, arises in these conventional techniques.

SUMMARY OF THE INVENTION

An object of the present invention is to solve this problem, that is, an object of the present invention is to provide a lithographic printing plate precursor which can be used for printing with no treatment after exposure-by being mounted directly on a press, excellent in scumming-resistance and press life.

As a result of eager investigation by the present inventors, the above object can be achieved by using a hydrophilic layer containing a specific hydrophilic matrix and fine particles having a specific core-shell structure. That is, the present invention is as follows.

1. A lithographic printing plate precursor comprising a support having provided thereon a hydrophilic layer which is converted to hydrophobic by heating, wherein the hydrophilic layer contains (1) an organic and inorganic composite having a crosslinking structure obtained by hydrolysis and polycondensation on condition of coexistence of a metal complex compound and an organic hydrophilic resin, and (2) core-shell structural fine particles containing a resin core having a functional group capable of interacting with the organic and inorganic composite and a resin shell not substantially having a functional group capable of interacting with the organic and inorganic composite.

2. The lithographic printing plate precursor as described in the above item 1, wherein the metal complex compound is at least one alkoxide of metal selected from Si, Ti, Zr and Al.

3. The lithographic printing plate precursor as described in the above item 1 or 2, wherein the organic and inorganic composite has a hydrophilic graft chain.

DETAILED DESCRIPTION OF THE INVENTION

The lithographic printing plate precursor according to the present invention is described in detail below. In the specification, "%" means "mass % (i.e., weight %)" unless otherwise indicated.

The lithographic printing plate precursor according to the present invention has on a support a hydrophilic layer which is converted to hydrophobic by heating and can form an image. The lithographic printing plate precursor may have a heat-insulating layer as the under layer of the hydrophilic layer. Further, the lithographic printing plate precursor may have a water-soluble protective layer on the hydrophilic layer. Each constitute of the lithographic printing plate precursor according to the present invention is described in detail below.

Hydrophilic Layer:

The hydrophilic layer in the present invention contains an organic and inorganic composite and core-shell structural fine particles, and the organic and inorganic composite is a product having a crosslinking structure obtained by hydrolysis and polycondensation on condition of coexistence of a metal complex compound and an organic hydrophilic resin, and the core-shell structural fine particles are fine particles contain a resin core having a functional group capable of interacting with the organic and inorganic composite and a resin shell not substantially having a functional group capable of interacting with the organic and inorganic composite.

Organic and Inorganic Composite:

As the metal complex compounds which form the organic and inorganic composite, a metal halide compound, a metal oxyacid salt, a metal organic acid salt, a metal chelate compound, and a metal alkoxide compound are exemplified. Of these compounds, a metal chelate compound and a metal alkoxide compound are more preferred, and a metal alkoxide compound is especially preferred.

As the central metals of these metal complex compounds, elements belonging to the second period to the sixth period of the Periodic Table are exemplified. Above all, the metals and semi-conductor elements belonging to the third period to the fifth period are preferred. Specifically, Al, Si and Mg of the third periodic metals, Ca, Ti, Mn, Fe, Co, Ni, Cu, Zn and Ge of the fourth periodic metals, and Zr, In and Sn of the fifth periodic metals are exemplified, and Si, Zr and Al are particularly preferred.

As the ligands of metal complex compounds, from unidentate ligands to hexadentate ligands are exemplified, specifically β-diketones, e.g., a halogen atom, an alkoxyl group and acetylacetone, ketoesters, e.g., methyl acetoacetate, hydroxycarboxylic acids, e.g., lactic acid, salicylic acid and tartaric acid, and the salts thereof, hydroxycarboxylic esters, e.g., methyl tartrate, keto alcohols, e.g., 4-hydroxy-4-methyl-2-pentanone, amino alcohols, e.g., triethanolamine, and enolic active hydrogen compounds, e.g., diethyl malonate ester and methylolmelamine are exemplified.

The specific examples of the metal complex compounds include tetrachlorosilane, tetrabromosilane, tetramethoxysilane, tetraethoxysilane, tetraisopropoxysilane, tetra-n-propoxysilane, tetra-t-butoxysilane, tetra-n-butoxysilane, methyltrimethoxysilane, methyltriethoxysilane, methyltriisopropoxysilane, methyltri-t-butoxysilane, ethyltrimethoxysilane, ethyltriethoxysilane, ethyltriisopropoxysilane, ethyltri-t-butoxysilane, n-propyltrimethoxysilane, n-propyltriethoxysilane, n-propyltriisopropoxysilane, n-propyltri-t-butoxysilane, n-hexyltrimethoxysilane, n-hexyltriethoxysilane, n-hexyltriisopropoxysilane, n-hexyltri-t-butoxysilane, n-decyltrimethoxysilane, n-decyltriethoxysilane, n-decyltriisopropoxysilane, n-decyltri-t-butoxysilane, n-octadecyltrimethoxysilane, n-octadecyltriethoxysilane, n-octadecyltriisopropoxysilane, n-octadecyltri-t-butoxysilane, phenyltrimethoxysilane, phenyltriethoxysilane, phenyltriisopropoxysilane phenyltri-t-butoxysilane, dimethoxydiethoxysilane, dimethyldimethoxysilane, dimethyldiethoxysilane, diphenyldimethoxysilane, diphenyldiethoxysilane, phenylmethyldimethoxysilane, phenylmethyldiethoxysilane, triethoxyhydrosilane, trimethoxyhydrosilane, isopropoxyhydrosilane, tri-t-butoxyhydrosilane, vinyltrimethoxysilane, vinyltriethoxysilane, vinyltriisopropoxysilane, vinyltri-t-butoxysilane, trifluoropropyltrimethoxysilane, trifluoropropyltriethoxysilane, trifluoropropyltriisopropoxysilane, trifluoropropyltri-t-butoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri-t-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane, β-(3,4-epoxycyclohexyl)ethyltrimethoxysilane, β-(3,4-epoxycyclohexyl)ethyltriethoxysilane, tetraethyltitanate, tetra-iso-propyltitanate, tetra-n-butyltitanate, tetra-2-ethylhexyltitanate, tetrastearyltitanate, di-iso-propoxy-bis(acetylacetone)titanate, di-n-butoxy-bis(triethanolamine)titanate, dihydroxy-bis(lactic acid)titanate, tetraethylzirconate, tetra-iso-propylzirconate, tetra-n-butylzirconate, tetra-2-ethylhexylzirconate, zirconium acetate, ammonium zirconium carbonate, and tetraacetylacetonatozirconate, triethylaluminate, tri-iso-propylaluminate, tri-n-butylaluminate, tri-2-ethylhexylaluminate, ethylacetoacetatoaluminumdiisopropylate, and aluminum-tris(ethylacetoacetate).

The organic hydrophilic resins for forming the organic and inorganic composite according to the present invention may be organic hydrophilic polymers or copolymers capable of crosslinking with a metal complex compound or interacting such as hydrogen bonding.

The specific examples of the organic hydrophilic resins include polymers and copolymers of a monomer unit selected from vinyl alcohol, acrylamide, methylol acrylamide, methylol methacrylamide, acrylacetamide, N,N-dimethyl acrylamide, 1-vinyl-2-pyrrolidinone, 2-acrylamide-2-methyl-1-propanesulfonic acid, acrylic acid, methacrylic acid, hydroxyethyl acrylate and hydroxyethyl methacrylate, and maleic anhydride-vinyl methyl ether copolymers.

As useful organic hydrophilic resins other than the above, organic hydrophilic resins having the residue of the above metal complex compounds as the crosslinking group can be exemplified. These organic hydrophilic resins are preferred, since they have a high hydrophilic property, they form firm organic and inorganic composites, and as a result, press life can be improved. A hydrophilic resin having silicon alkoxide residue is particularly suitable.

Specifically, hydrophilic resins having a structural unit represented by the following formula (I) or (II) can be exemplified. Since organic hydrophilic resins represented by formula (I) or (II) form organic and inorganic composites having hydrophilic graft chains when they are hydrolyzed with a metal complex compound and polycondensed, they are particularly preferred for forming a hydrophilic layer resistant to scumming and firm.

(I)

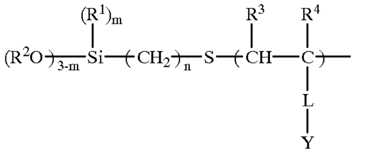

(II)

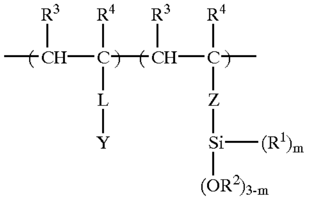

wherein $R^1$, $R^2$, $R^3$ and $R^4$ each represents a hydrogen atom or a hydrocarbon group having from 1 to 8 carbon atoms; m represents 0, 1 or 2; n represents an integer of from 1 to 8; L represents a single bond or an organic linking group; Y represents $—NHCOR^5$, $—CONH_2$, $—CON(R^5)_2$, $—COR^5$, —OH, $—CO_2M$, $—SO_3M$ or a 2-pyrrolidinon-1-yl group; $R^5$ represents a straight chain, branched or cyclic alkyl group having from 1 to 8 carbon atoms, when there are a plurality of $R^5$'s, such as $—CON(R^5)_2$, these $R^5$'s may be bonded to each other to form a ring, and the formed ring may be a heterocyclic ring containing hetero atoms, e.g., an oxygen atom, a sulfur atom, a nitrogen atom, etc.; M represents a hydrogen atom, an alkali metal, an alkaline earth metal or an onium; and Z represents an organic linking group.

When $R^1$, $R^2$, $R^3$ and $R^4$ each represents a hydrocarbon group, an alkyl group and an aryl group can be exemplified as the hydrocarbon group, and a straight chain, branched or cyclic alkyl group having 8 or less carbon atoms is preferred. Specifically, a methyl group, an ethyl group, a propyl group, a butyl group, a pentyl group, a hexyl group, a heptyl group, an octyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, and a cyclopentyl group are exemplified. A hydrogen atom, a methyl group and an ethyl group are more preferred in view of addition effect and easy availability.

These hydrocarbon groups may further have a substituent. Monovalent non-metallic atomic groups exclusive of a hydrogen atom are used as the substituents. The examples of preferred substituents include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N,N-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (herein after referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonoxy group ($—OPO_3H_2$) and a conjugate base group thereof (hereinafter referred to as a phosphonatoxy group), a dialkylphosphonoxy group ($—OPO_3(alkyl)_2$), a diarylphosphonoxy group ($—OPO_3(aryl)_2$), an alkylarylphosphonoxy group ($—OPO_3(alkyl)(aryl)$), a monoalkylphosphonoxy group ($—OPO_3H(alkyl)$) and a conjugate base group thereof (hereinafter referred to as an alkylphosphonatoxy group), a monoarylphosphonoxy group ($—OPO_3H(aryl)$) and a conjugate base group thereof (hereinafter referred to as an arylphosphonatoxy group), a morpholino group, a cyano group, a nitro group, an aryl group, an alkenyl group, and an alkynyl group.

As the specific examples of the alkyl groups in these substituents, the above-described alkyl groups can be exemplified. As the specific examples of the aryl groups in these substituents, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group can be exemplified. As the examples of the alkenyl groups in the substituents, a vinyl group, a 1-propenyl group, a 1-butenyl group, a cinnamyl group, and a 2-chloro-1-ethenyl group can be exemplified, and as the examples of the alkynyl groups, an ethynyl group, a 1-propynyl group, a 1-butynyl group and a trimethylsilylethynyl group can be exemplified. As $G_1$ in the acyl group ($G_1CO$—), a hydrogen atom and the above-described alkyl groups and aryl groups can be exemplified.

Of these substituents, more preferred groups include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

On the other hand, as the alkylene group in the substituted alkyl groups, divalent organic residues obtained by eliminating any one hydrogen atom on the above-described alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms. The specific examples of preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxyethyl group, a 2-oxypropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl) carbamoylethyl group, an N-methyl-N-(sulfophenyl)-carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)-sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When L represents an organic linking group, L represents a polyvalent linking group comprising non-metallic atoms, specifically those comprising from 1 to 60 carbon atoms, from 0 to 10 nitrogen atoms, from 0 to 50 oxygen atoms, from 1 to 100 hydrogen atoms, and from 0 to 20 sulfur atoms. As more specific example of the linking groups, the following structural units or those comprising the following structural units in combination can be exemplified.

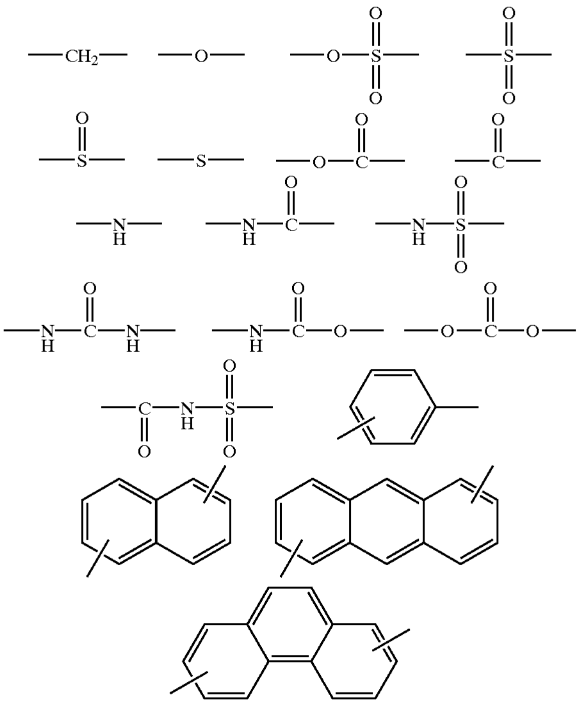

As the alkyl group having from 1 to 8 carbon atoms represented by $R^5$ which constitutes Y in the above formulae, a methyl group, an ethyl group, a propyl group, a butyl group, a pentyl group, a hexyl group, a heptyl group, an octyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, and a cyclopentyl group are preferably exemplified.

$R^5$ may further have a substituent, and as the substituents which can be used, the substituents which can be used when the above $R^1$, $R^2$, $R^3$ and $R^4$ each represents an alkyl group are similarly exemplified.

M specifically represents a hydrogen atom; an alkali metal, e.g., lithium, sodium, potassium, etc.; an alkaline earth metal, e.g., calcium, barium, etc., oronium, e.g., ammonium, iodonium, sulfonium, etc.

Y specifically preferably represents $—NHCOCH_3$, $—CONH_2$, $—SO_3^-NMe_4^+$, —COOH, a morpholino group, or a 2-pyrrolidinon-1-yl group.

The organic linking group represented by Z comprises from 1 to 20 carbon atoms, from 0 to 5 nitrogen atoms, from 0 to 10 oxygen atoms, and from 1 to 40 hydrogen atoms. The following linking groups are exemplified as the specific examples.

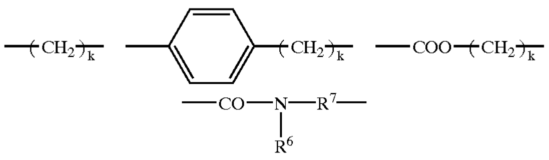

wherein $R^6$ represents a hydrogen atom or a hydrocarbon group having 8 or less carbon atoms, and has the same meaning as $R^1$ in formula (I). $R^7$ represents an alkylene group having 5 or less carbon atoms or a divalent organic residue bonding a plurality of chained carbon atomic groups by an oxygen atom or a nitrogen atom, and k represents an integer of from 0 to 4. As the specific examples of $R^7$, a methylene group, an ethylene group, a propylene group, a butylene group, a pentylene group, a 2,2-dimethylpropylene group, an ethylenoxyethylene group, an N-ethylene-N-methylaminoethylene group are exemplified.

The specific examples of organic hydrophilic resins having the structural unit represented by formula (I) or (II) are shown below, but the present invention are not limited thereto.

I-1

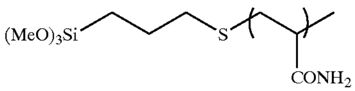

I-2

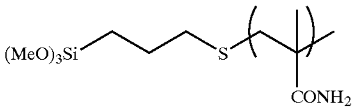

I-3

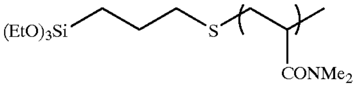

I-4

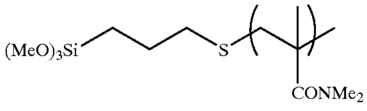

I-5

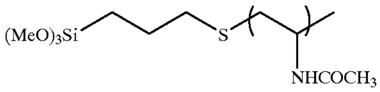

I-6

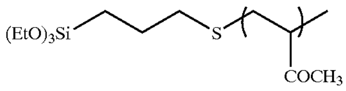

I-7

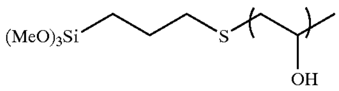

I-8

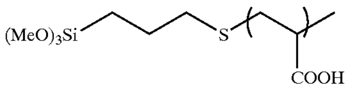

I-9

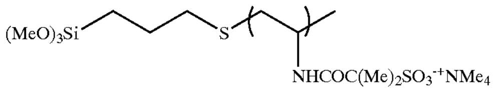

-continued

I-10

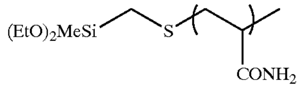

I-11

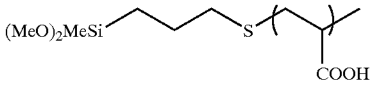

I-12

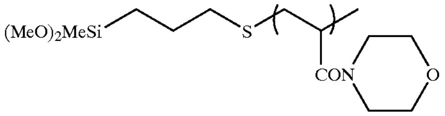

II-1

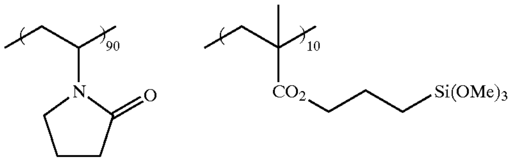

II-2

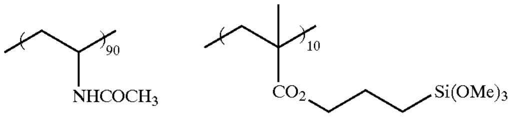

II-3

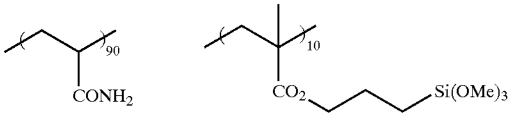

II-4

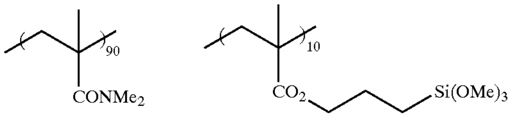

II-5

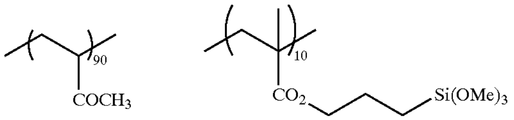

II-6

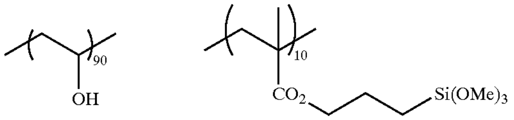

II-7

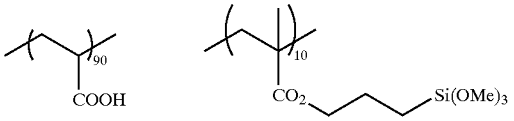

II-8

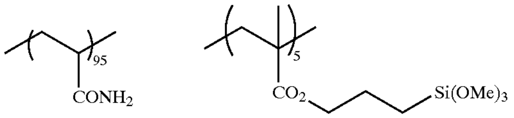

II-9

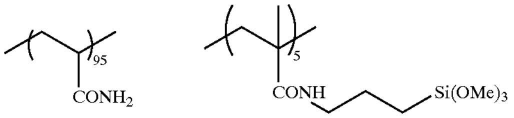

-continued

II-10

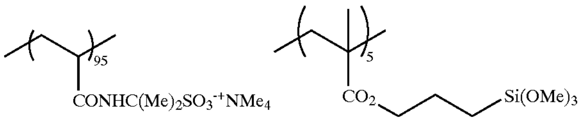

The hydrophilic resin represented by formula (I) according to the present invention can be synthesized by radical polymerization by using a radical polymerizable monomer represented by the following formula (i), and a silane coupling agent having a function of chain transfer in radical polymerization represented by the following formula (ii). Since the silane coupling agent has a function of chain transfer, a polymer having the silane coupling agent at terminal of the polymer main chain can be synthesized in the radical polymerization.

The hydrophilic resin represented by formula (II) according to the present invention can be synthesized by copolymerizing a radical polymerizable monomer represented by the following formula (i), and a radical polymerizable monomer having a silane coupling group represented by the following formula (iii).

(i)

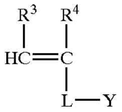

(ii)

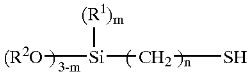

(iii)

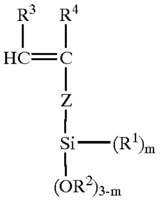

In the above formulae (i), (ii) and (iii), $R^1$, $R^2$, $R^3$, $R^4$, L, Y, Z, m and n each has the same meaning as in the above formulae (I) and (II).

An organic and inorganic composite in the present invention is formed by hydrolysis and polycondensation on condition of coexistence of a metal complex compound and an organic hydrophilic resin, by which organic and inorganic components can be dispersed homogeneously, as a result, a high hydrophilic property, high film strength and high press life can be obtained.

For obtaining a highly hydrophilic organic and inorganic composite, the ratio of an organic hydrophilic resin to a metal complex compound is 10% or more and less than 50%. When the ratio of an organic hydrophilic resin is higher than 50%, the hydrophilic property and the film strength are reduced, which lead to the reduction of the resistance to scumming and press life. Two or more organic hydrophilic resins may be used as mixture in the present invention.

For accelerating hydrolysis and polycondensation reaction in the manufacture of an organic and inorganic composite, it is preferred to use acidic catalysts or basic catalysts in combination.

As catalysts, acidic or basic compounds are used as they are, or they are used by being dissolved in water or a solvent such as an alcohol (hereinafter referred to as acidic catalysts or basic catalysts respectively). The concentration of catalysts is not particularly limited, but the velocities of hydrolysis and polycondensation are liable to be accelerated when they are in high concentration. However, precipitates are sometimes formed in a sol solution when basic catalysts in high concentration are used, so that the concentration of basic catalysts is preferably 1N (in terms of concentration in an aqueous solution) or less.

The kinds of acidic catalysts or the basic catalysts are not restricted but in the case where catalysts in high concentration must be used, catalysts constituted from the elements which hardly remain in the coated layer after drying are preferred. Specifically, as acidic catalysts, hydrogen halide such as hydrochloric acid, nitric acid, sulfuric acid, sulfurous acid, hydrogen sulfide, perchloric acid, hydrogen peroxide, carboxylic acids such as carbonic acid, formic acid and acetic acid, substituted carboxylic acid represented by RCOOH wherein R is substituted with other elements or substituents, and sulfonic acid such as benzene sulfonic acid can be exemplified, and as basic catalysts, ammoniacal bases such as aqueous ammonia, and amines such as ethylamine and aniline can be exemplified.

In the manufacture of the organic and inorganic composite according to the present invention, an organic and inorganic composite sol solution is obtained by dissolving a metal complex compound and an organic hydrophilic resin in a solvent, such as ethanol, adding the above catalyst and stirring the solution at room temperature for 1 to 72 hours, to thereby proceed hydrolysis and polycondensation. A coating solution is prepared by using the sol solution with other materials for a hydrophilic layer, such as polymer fine particles, and a hydrophilic layer is formed by coating the thus-obtained coating solution.

As described above, the hydrophilic layer in the present invention using an organic and inorganic composite is formed by a sol-gel method. The details of the sol-gel method are described in Sumio Sakuhana, *Sol-Gel Ho no Kagaku* (*Chemistry of Sol-Gel Method*), Agune Shofu-Sha (1988) and Seki Hirashima, *Saishin Sol-Gel Ho ni yoru Kino-Sei Hakumaku Sakusei Gijutsu* (*Producing Techniques of Functional Thin Film by the Latest Sol-Gel Method*), Sogo Gijutsu Center (1992).

Core-shell Structural Fine Particles:

The core-shell structural fine particles contained in the hydrophilic layer in the present invention are fine particles comprising a core part containing a resin having a functional group capable of interacting with the organic and inorganic composite and a shell part containing a resin not substantially having a functional group capable of interacting with the organic and inorganic composite.

Such a functional group capable of interaction is a functional group capable of forming any of a chemical bond, a hydrogen bond and an electrostatic bond together with the hydrolyzed and polycondensed product of the metal alkoxide or the functional group in the organic hydrophilic resin forming the hydrophilic layer. The specific examples of such functional groups are shown below, but the present invention is not limited thereto.

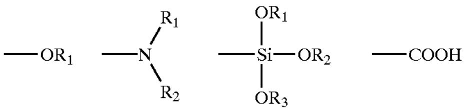

-continued

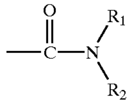
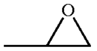
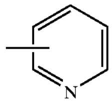
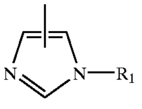
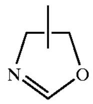
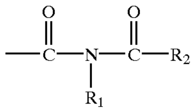

wherein $R_1$, $R_2$ and $R_3$ each represents a hydrogen atom, an alkyl group, an aryl group, an alkynyl group or an alkenyl group.

The core-shell structural fine particles for use in the lithographic printing plate precursor according to the present invention can be synthesized by well-known methods. For example, the fine particles can be synthesized by multi-stage-emulsion polymerization of in the first place emulsion-polymerizing the monomer having the functional group or, if necessary, emulsion-polymerizing with the monomer having the functional group by further adding the monomer not having the functional group and a polyfunctional monomer, and then further emulsion-polymerizing the monomer not having the functional group.

As the specific examples of the monomers having a functional group capable of interaction which are used in the synthesis of the core-shell structural fine particles in the present invention, the following monomers are exemplified, but the present invention is not limited thereto.

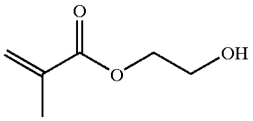
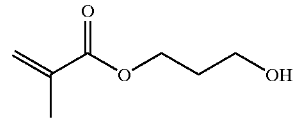
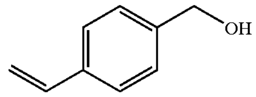
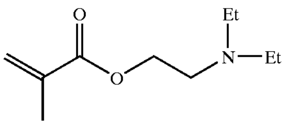
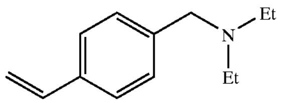
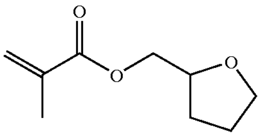
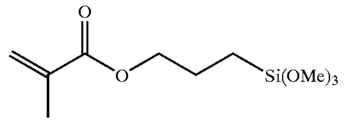
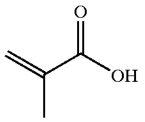
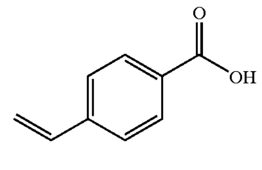
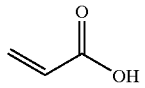

-continued

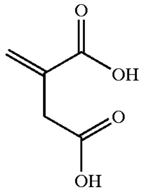
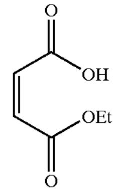
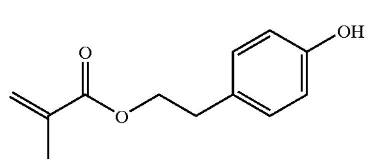
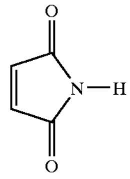
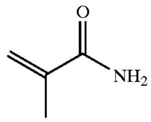
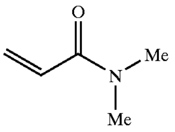
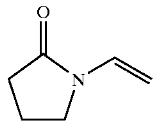
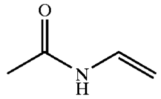
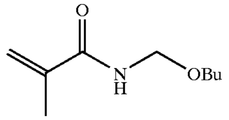
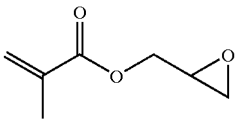
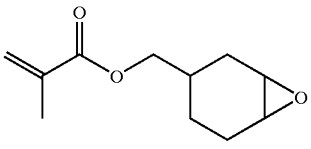
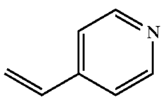
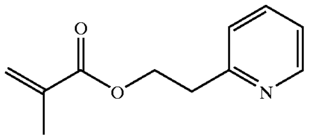
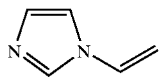
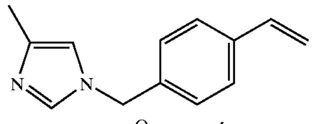
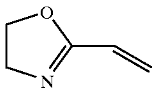
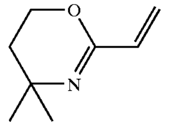

As the specific examples of the monomers not having a functional group capable of interaction which are used in the synthesis of the core-shell structural fine particles in the present invention, well-known monomers, e.g., acrylic esters, methacrylic esters, maleic esters, itaconic esters, crotonic esters, fumaric esters, mesaconic esters, α,β-unsaturated lactones, unsaturated hydrocarbons, vinyl esters, α,β-unsaturated ketones, styrenes, and acrylonitriles are exemplified, but the present invention is not limited thereto.

The specific examples of acrylic esters include methyl acrylate, ethyl acrylate, (n- or i-)propyl acrylate, (n-, i-, sec- or t-)butyl acrylate, pentyl acrylate, hexyl acrylate, heptyl acrylate, octyl acrylate, nonyl acrylate, decyl acrylate, amyl acrylate, 2-ethylhexyl acrylate, dodecyl acrylate, chloroethyl acrylate, cyclohexyl acrylate, allyl acrylate, benzyl acrylate, chlorobenzyl acrylate, phenyl acrylate, and chlorophenyl acrylate.

The specific examples of methacrylic esters include methyl methacrylate, ethyl methacrylate, (n- or i-)propyl methacrylate, (n-, i-, sec- or t-)butyl methacrylate, pentyl methacrylate, hexyl methacrylate, heptyl methacrylate, octyl methacrylate, nonyl methacrylate, decyl methacrylate, amyl methacrylate, 2-ethylhexylmethacrylate, dodecylmethacrylate, chloroethyl methacrylate, cyclohexyl methacrylate, allyl methacrylate, benzyl methacrylate, chlorobenzyl methacrylate, phenyl methacrylate, and chlorophenyl methacrylate.

The specific examples of crotonic esters include methyl crotonate, ethyl crotonate, (n- or i-)propyl crotonate, (n-, i-, sec- or t-)butyl crotonate, pentyl crotonate, hexyl crotonate, heptyl crotonate, octyl crotonate, nonyl crotonate, decyl crotonate, amyl crotonate, 2-ethylhexyl crotonate, dodecyl crotonate, chloroethyl crotonate, cyclohexyl crotonate, allyl crotonate, benzyl crotonate, chlorobenzyl crotonate, phenyl crotonate, and chlorophenyl crotonate.

The specific examples of maleic esters include dimethyl maleate, diethyl maleate, (n- or i-)dipropyl maleate, (n-, i-, sec- or t-)dibutyl maleate, diphenylmaleate, diallylmaleate, dibenzyl maleate, methylethyl maleate, methylpropyl maleate, and ethylpropyl maleate.

The specific examples of itaconic esters include. dimethyl itaconate, diethyl itaconate, (n- or i-)dipropyl itaconate, (n-, i-, sec- or t-)dibutyl itaconate, diphenyl itaconate, diallyl itaconate, dibenzyl itaconate, and ethylpropyl itaconate.

The specific examples of fumaric esters include dimethyl fumarate, diethyl fumarate, (n- or i-)dipropyl fumarate, (n-, i-, sec- or t-)dibutyl fumarate, diphenyl fumarate, diallyl fumarate, dibenzyl fumarate, methylethyl fumarate, methylpropyl fumarate, and ethylpropyl fumarate.

The specific examples of mesaconic esters include dimethyl mesaconate, diethyl mesaconate, (n- or i-)dipropyl mesaconate, (n-, i-, sec- or t-)dibutyl mesaconate, diphenyl mesaconate, diallyl mesaconate, dibenzyl mesaconate, methylethyl mesaconate, methylpropyl mesaconate, and ethylpropyl mesaconate.

The specific examples of styrenes include styrene, methylstyrene, dimethylstyrene, trimethylstyrene, ethylstyrene, propylstyrene, cyclohexylstyrene, chloromethylstyrene, trifluoromethylstyrene, acetoxymethylstyrene, chlorostyrene, dichlorostyrene, bromostyrene, iodostyrene, fluorostyrene, and sodium 4-vinylbenzenesulfonate.

As the specific examples of α,β-unsaturated lactones, the following compounds can be exemplified.

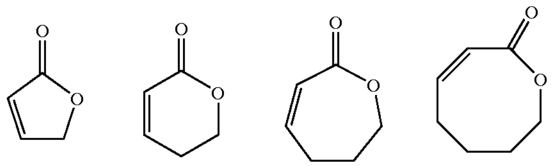

-continued

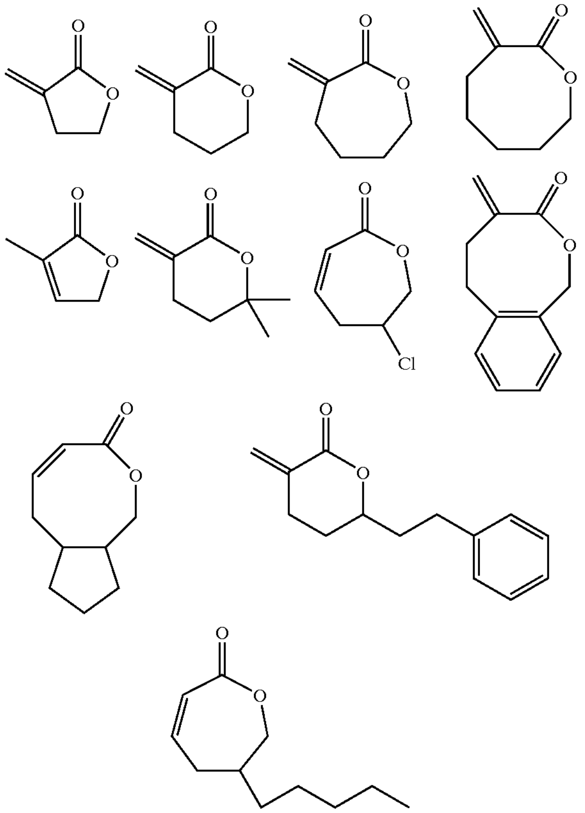

As the specific examples of unsaturated hydrocarbons, ethylene, propylene, isobutylene, butadiene, and isoprene are exemplified.

As the specific examples of vinyl esters, vinyl acetate, vinyl chloroacetate, vinyl butyrate, and vinyl benzoate are exemplified.

As the specific examples of α,β-unsaturated ketones, methyl vinyl ketone, ethyl vinyl ketone, propyl vinyl ketone, and phenyl vinyl ketone are exemplified.

Polyfunctional monomers for use in the present invention are monomers having a plurality of polymerizable unsaturated groups. Further, the polyfunctional monomers may also have the above-described functional groups capable of interacting with an organic and inorganic composite. The specific examples of the polyfunctional monomers are shown below, but the present invention is not limited to these compounds.

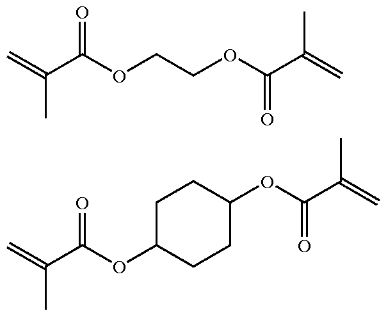

-continued
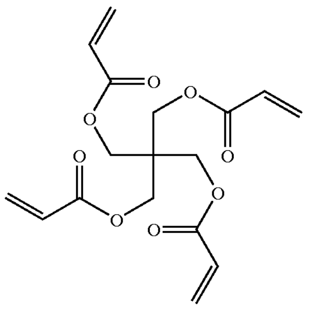
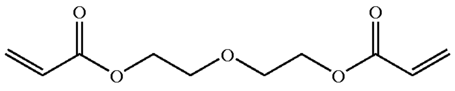
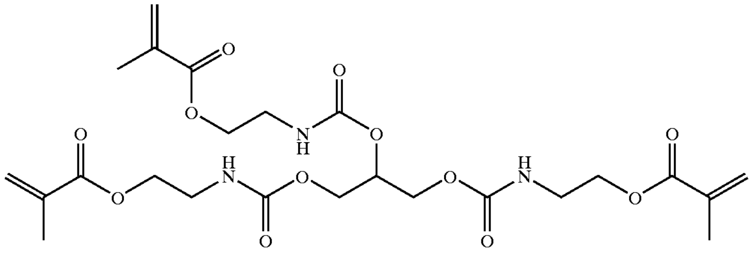
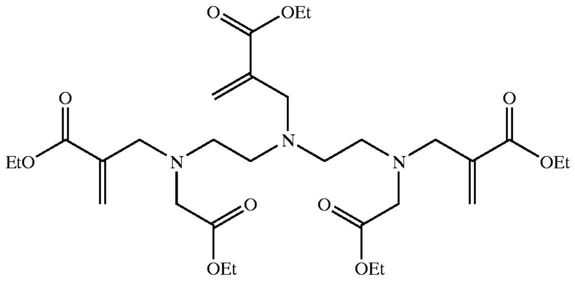
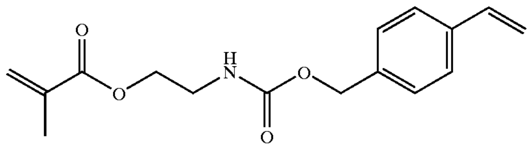
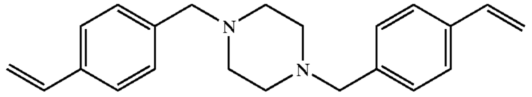
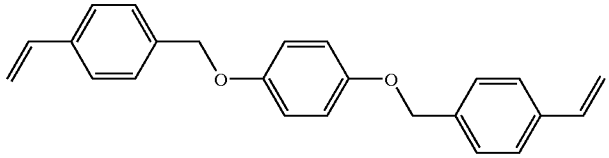
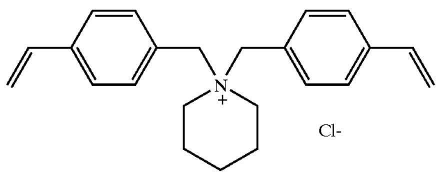
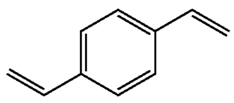

-continued

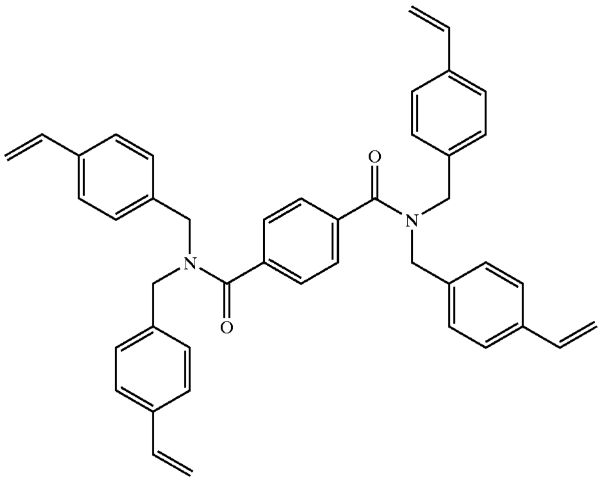

For synthesizing the core part of the core-shell structural fine particles for use in the present invention, the monomers having a functional group capable of interaction may be homopolymerized, or two or more of these monomers may be copolymerized, or the monomers having a functional group capable of interaction may be copolymerized with monomers not having a functional group capable of interaction so long as the effect of the present invention is not hindered, or further, may be crosslinked by copolymerization with the above polyfunctional monomers so long as the effect of the present invention is not hindered.

The introduction ratio of the monomers having a functional group capable of interaction into a resin for synthesizing the core part of the core-shell structural fine particles for use in the present invention is preferably 5 mol % or more, and more preferably 10 mol % or more. By the introduction of the monomers of 5 mol % or more, sufficient interaction can be obtained with the hydrolyzed and polycondensed product of the metal alkoxide or the organic hydrophilic resin constituting the hydrophilic layer, as a result, good image area press life can be exhibited.

When the core resin is synthesized by using a polyfunctional monomer, the content of the polyfunctional monomer is not restricted so long as the effect of the present invention is not hindered, but the content is preferably 20 mol % or less, and more preferably 10 mol % or less. An image-forming property and sensitivity are improved when the core resin is synthesized within this range of the polyfunctional monomer.

The specific examples of the resins forming the core part of the core-shell structural fine particles for use in the present invention are shown below, but the present invention is not limited thereto. In the following structural formulae, the numerals in parentheses show mol %.

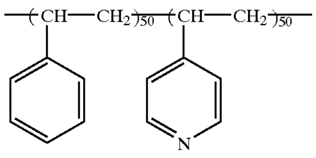

-continued

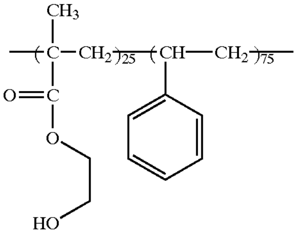

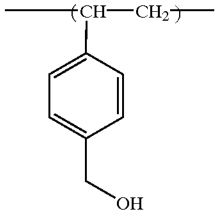

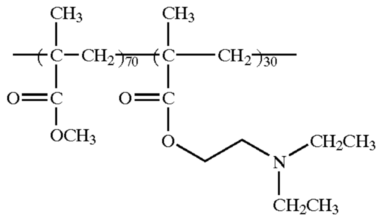

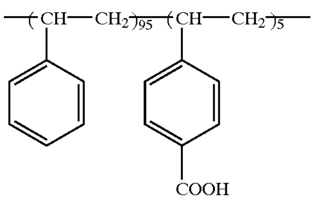

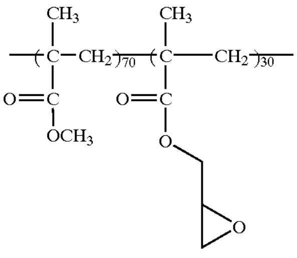

-continued
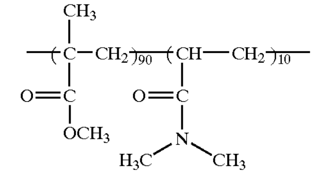
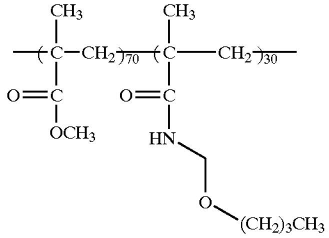
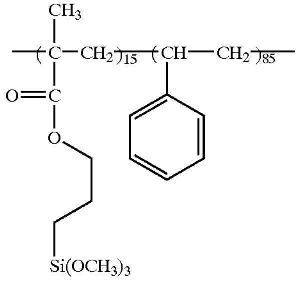
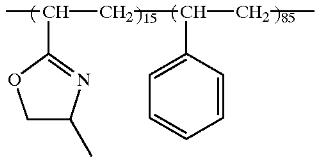
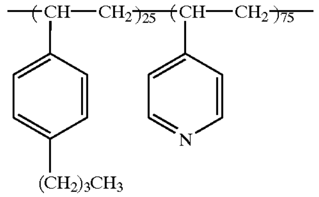
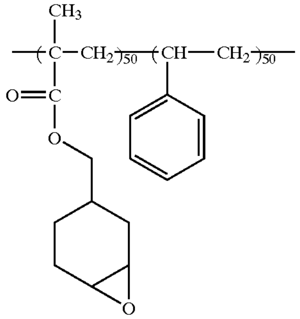
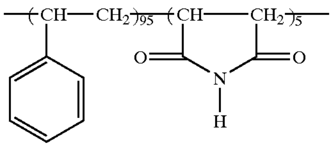
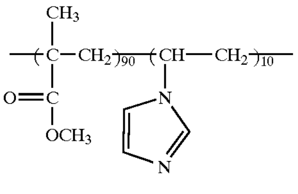
-continued
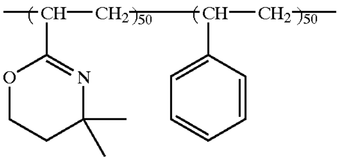
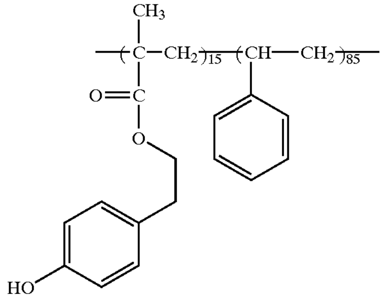
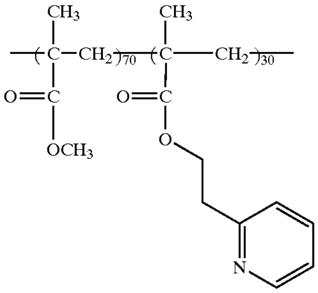
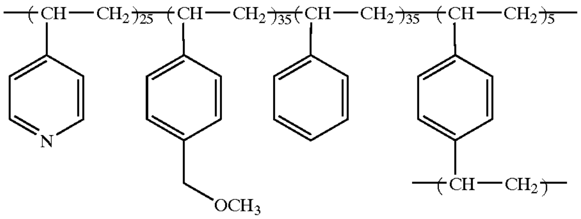
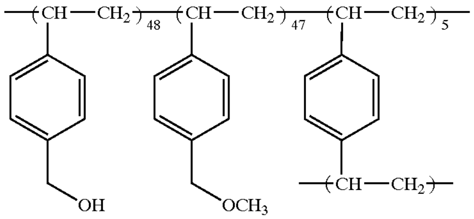
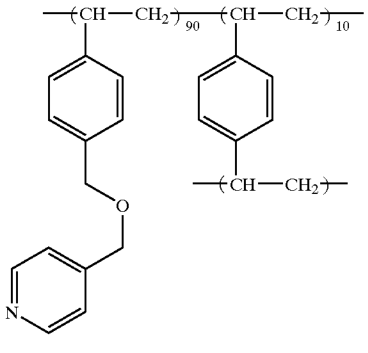

-continued

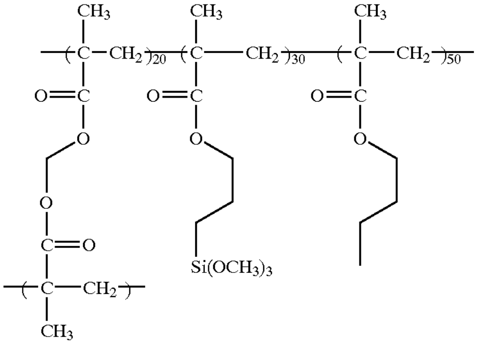

The softening temperature of the resins forming the core part of the core-shell structural fine particles for use in the present invention measured by a strain gauge method is preferably from 60 to 200° C., and more preferably from 80 to 180° C. When the softening temperature of the resins is in the range of from 60 to 200° C., good storage stability and sensitivity of a lithographic printing plate precursor can be obtained. A strain gauge method is a method of putting the powdered core fine particles between a copper plate and a glass plate, heating the copper plate with applying pressure to the core fine particles from the glass plate side, and measuring the change of pressure to the temperature of the copper plate. In this measuring method, the temperature at which the pressure begins to change is taken as a softening temperature.

The average particle diameter of the core part of the core-shell structural fine particles for use in the present invention is preferably from 10 to 200 nm, and more preferably from 20 to 150 nm. When the average particle diameter is in the range of from 10 to 200 nm, good press life and resistance to scumming can be obtained.

The molecular weight of the resins forming the core part of the core-shell structural fine particles for use in the present invention is not particularly limited, but the weight average molecular weight measured by GPC is preferably 2,000 or more, more preferably from 5,000 to 1,000,000, and the number average molecular weight is preferably 800 or more, more preferably from 1,000 to 1,000,000. The degree of polydispersion (=weight average molecular weight/number average molecular weight) is preferably 1 or more, and more preferably from 1.1 to 10.

These resins having a group capable of interaction may comprise any of random polymers, block polymers and graft polymers, but random polymers are preferably used.

For synthesizing the shell part of the core-shell structural fine particles for use in the present invention, the monomers not having a functional group capable of interaction may be homopolymerized, or two or more of these monomers may be copolymerized, or the monomers not having a functional group capable of interaction maybe copolymerized with monomers having a functional group capable of interaction so long as the effect of the present invention is not hindered, or may be crosslinked by copolymerization with the above polyfunctional monomers so long as the effect of the present invention is not hindered.

The introduction ratio of the monomers not having a functional group capable of interaction into a resin for synthesizing the shell part of the core-shell structural fine particles for use in the present invention is preferably 95 mol % or more, and more preferably 97 mol % or more. By the introduction in this range, the monomers do not substantially interact with the hydrolyzed and polycondensed product of the metal alkoxide and the organic hydrophilic resin constituting the hydrophilic layer, as a result, good scratch resistance of the non-image area can be obtained.

The specific examples of the resins for forming the shell part of the core-shell structural fine particles for use in the present invention include polystyrene, polymethyl methacrylate, methyl methacrylate-n-butyl methacrylate copolymer, methyl methacrylate-benzyl methacrylate copolymer, and styrene-4-butylstyrene copolymer, but the present invention is not limited thereto.

The softening temperature of the resins forming the shell part of the core-shell structural fine particles for use in the present invention measured by a strain gauge method is preferably from 60 to 200° C., and more preferably from 80 to 180° C. When the softening temperature of the resins is in the range of from 60 to 200° C., good storage stability and sensitivity of a lithographic printing plate precursor can be obtained.

The average coating thickness of the shell part of the core-shell structural fine particles for use in the present invention is preferably from 2 to 100 nm, and more preferably from 5 to 50 nm. When the average coating thickness is 2 nm or more, good scumming resistance can be obtained, since the interaction between the group capable of interaction in the core part and the hydrophilic layer can be sufficiently cut off, and when 100 nm or less, high speed and good press life can be obtained, since the resin in the core part which is softened by heat generated by virtue of light-to-heat conversion by heating or laser beam irradiation can sufficiently interact with the hydrophilic layer.

The molecular weight of the resins forming the shell part of the core-shell structural fine particles for use in the present invention is not particularly limited, but the weight average molecular weight measured by GPC is preferably 2,000 or more, more preferably from 5,000 to 1,000,000, and the number average molecular weight is preferably 800 or more, more preferably from 1,000 to 1,000,000. The degree of polydispersion (=weight average molecular weight/number average molecular weight) is preferably 1 or more, and more preferably from 1.1 to 10.

These resins forming the shell part may comprise any of random polymers, block polymers and graft polymers, but random polymers are preferably used.

The mass ratio (i.e., the weight ratio) of the resins forming the core part and the resins forming the shell part of the core-shell structural fine particles for use in the present invention may be any mass ratio so long as the above average particle diameter of the core part and the covering thickness of the shell part are satisfied.

It is preferred to use an emulsifier in synthesis of the core-shell structural fine particles for use in the present invention. The examples of emulsifiers include carboxylate, e.g., potassium laurate and sodium oleate, sulfate, e.g., sodium octylsulfate and sodium dodecylsulfate, sulfonate, e.g., sodium dodecylbenzenesulfonate and dioctyl sodium sulfosuccinate, phosphate, e.g., sodium lauryl phosphate, amine salt, e.g., laurylamine hydrochloride and stearylamine acetate, pyridinium salt, e.g., lauryl pyridinium chloride and cetyl pyridinium chloride, quaternary ammonium salt, e.g., lauryltrimethylammonium chloride and lauroylaminopropyldimethylhydroxyethylammonium perchlorate, glycerol fatty acid ester, e.g., glycerol monolaurate and glycerol monostearate, sorbitan derivative, e.g., sorbitan monolaurate and sorbitan monopalmitate, a betaine type ampholytic emulsifier, e.g., dimethyllauryl betaine, and emulsifiers having the structural formulae shown below. However, the present invention is not limited to these compounds.

$C_{12}H_{25}-[O-CH_2-CH_2]_n-OH$ (1)
$C_{13}H_{27}-[O-CH_2-CH_2]_n-OH$ (2)
$C_{16}H_{33}-[O-CH_2-CH_2]_n-OH$ (3)
$C_{18}H_{37}-[O-CH_2-CH_2]_n-OH$ (4)
$C_{18}H_{35}-[O-CH_2-CH_2]_n-OH$ (5)
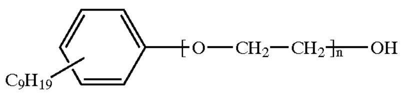
(6)
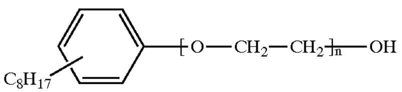
(7)
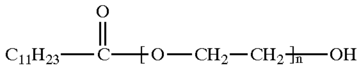
(8)
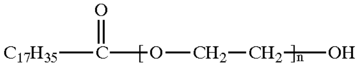
(9)
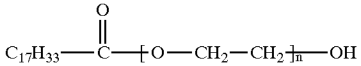
(10)
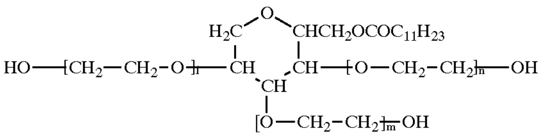
(11)
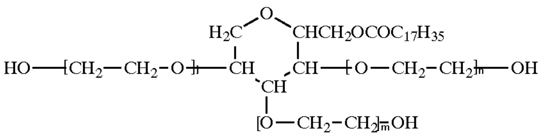
(12)
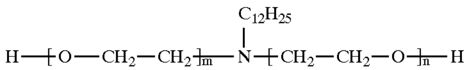
(13)
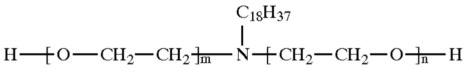
(14)
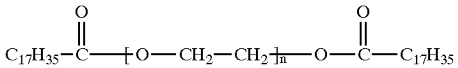
(15)

-continued
(16)
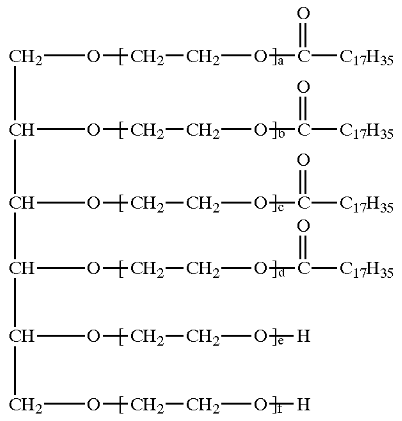
(17)
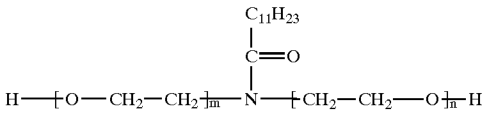
(18)
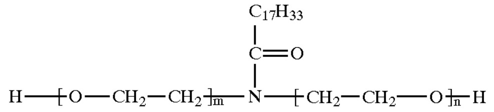
(19)
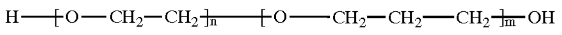
(20)
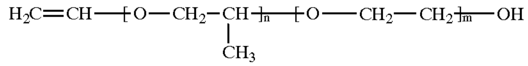
(21)
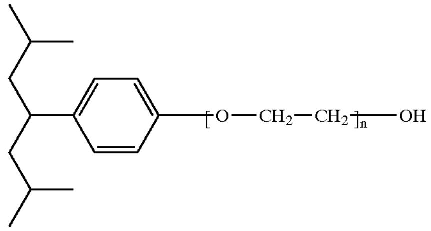
(22)
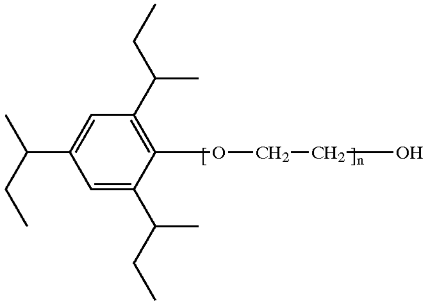

-continued
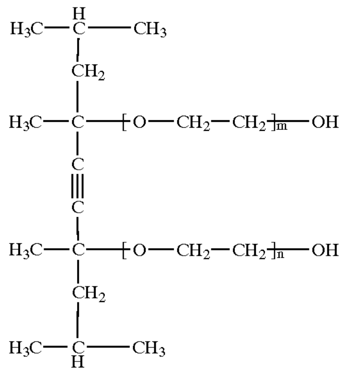
(23)
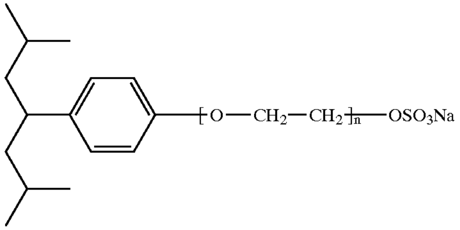
(24)
$C_{12}H_{25}-[O-CH_2-CH_2]_n-OSO_3Na$ (25)
$C_8H_{17}-[O-CH_2-CH_2]_n-OSO_3Na$ (26)
$C_{17}H_{35}-[O-CH_2-CH_2]_n-OSO_3Na$ (27)
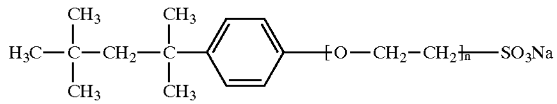
(28)
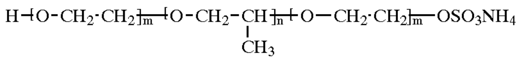
(29)
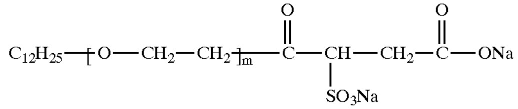
(30)
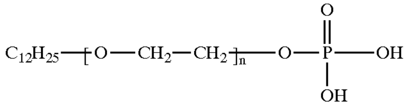
(31)
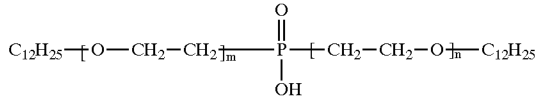
(32)
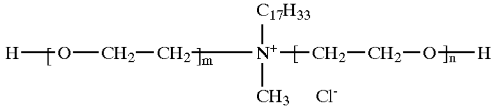
(33)

These emulsifiers may be used alone or two or more of them may be used as mixture.

Well-known initiators, e.g., peroxide initiators and azo-based initiators, can be used as the initiators for use in synthesis of the core-shell structural fine particles for use in the present invention.

The addition amount of the core-shell structural fine particles is preferably from 20 to 98% of the solid content in the hydrophilic layer, and more preferably from 30 to 95%.

Light-to-Heat Converting Substance:

When an image is recorded by scanning exposure on a lithographic printing plate precursor in the present invention, it is preferred to contain a light-to-heat converting substance for converting light energy to heat energy somewhere on the lithographic printing plate precursor. As the part to contain the light-to-heat converting substance, a hydrophilic layer, a heat-insulating layer between a support and a hydrophilic layer, a water-soluble protective layer, the surface layer of a support and a support are exemplified. The light-to-heat converting substance may be contained in a plurality of parts.

Light-to-heat converting substances for use in the present invention are not particularly restricted, and all the substances which can absorb lights, such as ultraviolet rays, visible rays, infrared rays and white lights, and convert these lights into heat can be used, e.g., carbon black, carbon graphite, pigments, phthalocyanine pigments, iron powder, graphite powder, iron oxide powder, lead oxide, silver oxide, chromium oxide, iron sulfide, and chromium sulfide are exemplified. Particularly preferred light-to-heat converting substances are dyes, pigments and metals which efficiently absorb infrared rays of wavelengths of from 760 to 1,200 nm.

As dyes for this purpose, commercially available and well-known dyes described, e.g., in *Senryo Binran* (*Dye Handbook*), compiled by Yuki Gosei Kagaku Kyokai (1970) can be utilized. Specifically, azo dyes, metal complex azo dyes, pyrazolone azo dyes, anthraquinone dyes, phthalocyanine dyes, carbonium dyes, quinoneimine dyes, methine dyes, cyanine dyes and metal thiolate complexes can be used. As preferred dyes, e.g., the cyanine dyes disclosed in Japanese Patent Laid-Open Nos. 125246/1983, 84356/1984, 78787/1985, 268512/1998, and U.S. Pat. No. 4,973,572, the methine dyes disclosed in Japanese Patent Laid-Open Nos. 173696/1983, 181690/1983 and 194595/1983, the naphthoquinone dyes disclosed in Japanese Patent Laid-Open Nos. 112793/1983, 224793/1983, 48187/1984, 73996/1984, 52940/1985 and 63744/1985, the squarylium dyes disclosed in Japanese Patent Laid-Open No. 112792/1983, and the cyanine dyes disclosed in British Patent 434,875 are exemplified.

Further, the near infrared-absorbing sensitizers disclosed in U.S. Pat. No. 5,156,938, the substituted arylbenzo(thio) pyrylium salts disclosed in U.S. Pat. No. 3,881,924, the trimethine thiapyrylium salts disclosed in Japanese Patent Laid-Open No. 142645/1982 (corresponding to U.S. Pat. No. 4,327,169), the pyrylium-based compounds disclosed in Japanese Patent Laid-Open Nos. 181051/1983, 220143/1983, 41363/1984, 84248/1984, 84249/1984, 146063/1984 and 146061/1984, the cyanine dyes disclosed in Japanese Patent Laid-Open No. 216146/1984, the pentamethine thiopyrylium salt disclosed in U.S. Pat. No. 4,283,475, and the pyrylium compounds disclosed in Japanese Patent Publication Nos. 13514/1993 and 19702/1993 are also preferably used in the present invention. As other example of preferred dyes, near infrared-absorbing dyes disclosed in U.S. Pat. No. 4,756,993 as the compounds represented by formulae (I) and (II) can be exemplified. Of the above dyes, particularly preferred dyes are cyanine dyes, squarylium dyes, pyrylium salts and nickel thiolate complexes.

As the pigments for use in the present invention, commercially available pigments and pigments described in Color Index (C.I.) Binran (Color Index Handbook), *Saishin Ganryo Binran* (*The Latest Pigment Handbook*), compiled by Nippon Ganryo Gijutsu Kyokai (1977), *Saishin Ganryo Oyo Gijutsu* (*The Latest Pigment Applied Techniques*), published by CMC Publishing Co. (1986), *Insatsu Ink Gijutsu* (*Printing Ink Techniques*), CMC Publishing Co. (1984) can be used. Various kinds of pigments can be used, e.g., black pigments, yellow pigments, orange pigments, brown pigments, red pigments, purple pigments, blue pigments, green pigments, fluorescent pigments, metal powder pigments, and polymer-combined pigments can be exemplified. Specifically, insoluble azo pigments, azo lake pigments, condensed azo pigments, chelate azo pigments, phthalocyanine series pigments, anthraquinone series pigments, perylene series pigments, perinone series pigments, thioindigo series pigments, quinacridone series pigments, dioxazine series pigments, isoindolinone series pigments, quinophthalone series pigments, in-mold lake pigments, azine pigments, nitroso pigments, nitro pigments, natural pigments, fluorescent pigments, inorganic pigments, and carbon black can be used. Of these, carbon black is preferred.

These pigments can be used without surface treatment or may be surface-treated. As methods of surface treatments, a method of surface-coating with a resin and a wax, a method of adhering a surfactant, and a method of combining a reactive substance (e.g., a silane coupling agent, an epoxy compound and polyisocyanate) on the surface of a pigment can be exemplified. These surface treatment methods are described in *Kinzoku Sekken no Seishitsu to Oyo* (*Natures and Applications of Metal Soaps*), Saiwai Shobo Co., *Insatsu Ink Gijutsu* (*Printing Ink Techniques*), CMC Publishing Co. (1984), and *Saishin Ganryo Oyo Gijutsu* (*The Latest Pigment Applied Techniques*), CMC Publishing Co. (1986).

These pigments preferably have a particle size of preferably from 0.01 to 10 $\mu$m, more preferably from 0.05 to 1 $\mu$m, and particularly preferably from 0.1 to 1 $\mu$m. When the particle size of pigments is less than 0.1 $\mu$m, it is not preferred in the point of the stability of the dispersion in the coating solution of a light-to-heat converting substance-containing layer, and when the particle size exceeds 10 $\mu$m, it is not preferred in view of the uniformity of the light-to-heat converting substance-containing layer. Well-know dispersing methods used in the manufacture of inks and toners can be used as the dispersing methods of pigments. The examples of dispersing apparatus include a sand mill, an attritor, a pearl mill, a super-mill, a ball mill, an impeller, a disperser, a KD mill, a colloid mill, a dynatron, a three-roll mill, a pressure kneader, etc., and details thereof are described in *Saishin Ganryo Oyo Gijutsu* (*The Latest Pigment Applied Techniques*), CMC Publishing Co. (1986).

These dyes and pigments can be used in the ratio of from 0.01 to 50%, preferably from 0.1 to 10%, of the total solid contents in the light-to-heat converting substance-containing layer, and in the case of dyes, they can be used in the ratio of particularly preferably from 0.5 to 10% and in the case of pigments, in the ratio of particularly preferably from 3.1 to 10%. When the addition amount of dyes and pigments is less than 0.01%, sufficient improving effect of sensitivity cannot be obtained, and when the amount is more than 50%, the layer strength of the light-to-heat converting substance-containing layer becomes weak.

Other Additives to Hydrophilic Layer:

For the purpose of obtaining various characteristics, if necessary, a variety of compounds other than the above-described additives can be added to the hydrophilic layer of the lithographic printing plate precursor according to the present invention. These additives are described below.

Inorganic fine particles may be added to the hydrophilic layer of the present invention, and as the inorganic fine particles, silica, alumina, magnesium oxide, titanium oxide, magnesium carbonate, calcium alginate and mixtures of these compounds are exemplified as preferred examples. These compounds can be used for the purpose of heightening film strength and strengthening surface adhesion by surface roughening even if they are not light-to-heat convertible.

The inorganic fine particles preferably have an average particle size of from 5 nm to 10 μm, and more preferably from 10 nm to 1 μm. When the average particle of the inorganic fine particles is in this range, polymer fine particles and the metallic fine particles of the light-to-heat converting substance are stably dispersed in the organic and inorganic composite, sufficient film strength of the hydrophilic layer can be retained, and a non-image area resistant to printing scumming and excellent in hydrophilic property can be formed. These inorganic fine particles are easily available as commercial products, such as colloidal silica dispersion.

The addition amount of inorganic fine particles to the hydrophilic layer is preferably from 1.0 to 70% of the total solid contents in the hydrophilic layer, and more preferably from 5.0 to 50%.

Besides nonionic and anionic surfactants, the hydrophilic layer can contain cationic surfactants as disclosed in Japanese Patent Laid-Open No. 195356/1990, fluorine-containing surfactants, and ampholytic surfactants as disclosed in Japanese Patent Laid-Open Nos. 121044/1984 and 13149/1992. The addition amount of surfactants is preferably from 0.05 to 15% of the solid contents in the hydrophilic layer, and more preferably from 0.1 to 5%.

The specific examples of nonionic surfactants include polyoxyethylene alkyl ethers, e.g., polyoxyethylene lauryl ether, polyoxyethylene stearyl ether, polyoxyethylene cetyl ether, and polyoxyethylene oleyl ether; polyoxyethylene alkylaryl ethers, e.g., polyoxyethylene nonylphenyl ether; polyoxyethylene-polyoxypropylene block copolymers; composite polyoxyalkylene alkyl ethers, e.g., polyoxyethylene-polyoxypropylene block copolymers whose terminal hydroxyl groups have an aliphatic group having from 5 to 24 carbon atoms by ether bonding, and composite polyoxyalkylene alkylaryl ethers to which an alkyl-substituted aryl group is bonded by ether bonding; sorbitan fatty acid esters, e.g., sorbitan monolaurate, sorbitan monostearate, sorbitan tristearate, sorbitan monopalmitate, sorbitan monooleate and sorbitan trioleate; and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan tristearate and polyoxyethylene sorbitan trioleate.

The specific examples of anionic surfactants include alkylsulfonic acids, arylsulfonic acids, aliphatic carboxylic acids, alkylnaphthalenesulfonic acids, condensation products of alkylnaphthalenesulfonic acid or naphthalenesulfonic acid with formaldehyde, aliphatic sulfonic acids having from 9 to 26 carbon atoms, alkylbenzenesulfonic acids, and sulfuric acids and phosphoric acids containing polyoxyethylene, e.g., laurylpolyoxyethylenesulfuric acid, cetylpolyoxyethylenesulfonic acid, and oleylpolyoxyethylenephosphonic acid.

The specific examples of cationic surfactants include laurylamine acetate, lauryltrimethylammonium chloride, distearyldimethylammonium chloride, and alkylbenzyldimethylammonium chloride.

The specific examples of fluorine-containing surfactants include perfluoroalkylcarboxylate, perfluoroalkylphosphate, perfluoroalkyltrimethylammonium salt, perfluoroalkylbetaine, perfluoroalkyl alcohol, and ethylene oxide adducts of perfluoroalkylsulfonamide.

The specific examples of ampholytic surfactants include alkylcarboxybetaines, alkylaminocarboxylic acids, alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine type surfactants (e.g., Amorgen K, trade name, manufactured by Daiichi Kogyo Seiyaku Co., Ltd.).

For easily discriminating an image area from a non-image area after image formation, dyes having great absorption in the visible ray region can be used in the hydrophilic layer as the colorants of an image in the present invention. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the dyes disclosed in Japanese Patent Laid-Open No. 293247/1987 can be exemplified. In addition to these, phthalocyanine series pigments, azo series pigments and titanium oxide can also be preferably used. These dyes and pigments are used in the proportion of from 0.01 to 10% of all the solid contents in the hydrophilic layer.

Heat-Insulating Layer:

The lithographic printing plate precursor according to the present invention may have a heat-insulating layer as the under layer of the hydrophilic layer. The heat-insulating layer is low in heat conductivity and has a function of suppressing thermal diffusion to a support. Particularly when the support is a metal support having high heat conductivity, the heat-insulating layer is useful for increasing sensitivity. The heat-insulating layer is described below.

The heat-insulating layer contains an organic or inorganic resin as the main component. The organic or inorganic resin can be selected widely from among hydrophilic or hydrophobic resins.

As resins having a hydrophobic property, e.g., polyethylene, polypropylene, polyester, polyamide, acrylate resin, vinyl chloride resin, vinylidene chloride resin, polyvinyl butyral resin, nitrocellulose, polyacrylate, polymethacrylate, polycarbonate, polyurethane, polystyrene, vinyl chloride-vinyl acetate copolymer, vinyl chloride-vinyl acetate-vinyl alcohol copolymer, vinyl chloride-vinyl acetate-maleic acid copolymer, vinyl chloride-acrylate copolymer, and vinylidene chloride-acrylonitrile copolymer are exemplified.

Resins having a hydrophobic property consisting of water based emulsions can be used in the present invention. Water based emulsion is an aqueous solution of a hydrophobic polymer suspension having dispersed therein particles comprising fine polymer particles and, if necessary, a protective agent for stabilizing the dispersion of the polymer particles. The specific examples of the water based emulsions for use in the present invention include vinyl series polymer latexes (polyacrylate series, vinyl acetate series, and ethylene-vinyl acetate series latexes), conjugated diene series polymer latexes (methyl methacrylate-butadiene series, styrene-butadiene series, acrylonitrile-butadiene series, chloroprene series latexes), and polyurethane resins.

As hydrophilic resins, water-soluble resins such as polyvinyl alcohol (PVA), modified PVA, e.g., carboxyl-modified PVA, starch and derivatives thereof, cellulose derivatives, e.g., carboxymethyl cellulose and hydroxyethyl cellulose, ammonium alginate, polyacrylic acid, polyacrylate, polyethylene oxide, water-soluble urethane resins, water-soluble polyester resins, polyhydroxyethyl acrylate, polyethylene glycol diacrylate series polymers, N-vinylcarboxylic acid amide polymers, casein, gelatin, polyvinyl pyrrolidone, vinyl acetate-crotonic acid copolymers, and styrene-maleic acid copolymer are specifically exemplified.

It is preferred to use these hydrophilic resins by crosslinking and curing. As crosslinking agents, aldehydes such as glyoxal, melamine-formaldehyde resins, and urea-formaldehyde resins, methylol compounds such as N-methylolurea, N-methylolmelamine, and methylolated polyamide resins, active vinyl compounds such as divinyl sulfone and bis(β-hydroxyethylsulfonate), epoxy compounds such as epichlorohydrin, polyethylene glycol diglycidyl ether, polyamide-polyamine-epichlorohydrin adducts, and polyamide epichlorohydrin resins, ester compounds such as monochloroacetate and thioglycolate, polycarboxylic acids such as polyacrylic acid, methyl vinyl ether-maleic acid copolymers, boric acid, titanyl sulfate, inorganic crosslinking agents such as salts of Cu, Al, Sn, V and Cr, and modified polyamide-polyimide resins can be exemplified. In addition, crosslinking catalysts such as ammonium chloride, a silane coupling agent, a titanate coupling agent can be used in combination.

Further, as inorganic high polymers, inorganic matrices which are formed by sol/gel conversion are preferred. The sol/gel convertible polymers preferably used in the present invention are resinous structural high polymers wherein bonding groups bonded to a polyvalent element form a reticular structure via oxygen atoms, and at the same time the polyvalent metal has also non-bonded hydroxyl groups and alkoxyl groups and these groups are mixed to form a resinous structure. In the stage of hydroxyl groups and alkoxyl groups being predominant, these sol/gel convertible polymers are in sol state, and the reticular resinous structure is strengthened as dehydration condensation proceeds.

In addition to the nature of the resin composition that the degree of hydrophilic property varies, a part of hydroxyl groups are bonded to the solid fine particles and modify the surfaces of the solid fine particles, to thereby also vary the degree of hydrophilic property. The polyvalent elements of the polymers having sol/gel convertible hydroxyl groups and alkoxyl groups are aluminum, silicon, titanium and zirconium and all of these elements can be used in the present invention.

Of these resins for use in a heat-insulating layer, hydrophilic resins are particularly preferred from the point of the adhesion with the hydrophilic layer.

Besides the above, various substances can be added to a heat-insulating layer, e.g., a light-to-heat converting substance, inorganic fine particles and surfactants for the purpose of improving sensitivity, improving physical strength of the heat-insulating layer, improving the mutual dispersibility of the compositions constituting the heat-insulating layer, improving the coating property, and improving the adhesion with the hydrophilic layer. As such substances, those described above as the substances which can be added to the hydrophilic layer can be used in the same addition amount as in the hydrophilic layer.

Water-Soluble Protective Layer:

Since the surface of the lithographic printing plate precursor is hydrophilic, the printing plate precursor is liable to be hydrophobitized due to the influence of the atmosphere, susceptible to the influence of temperature and humidity, or liable to be mechanically scratched or contaminated when the printing plate precursor is transported or in storage as a product or during handling before use. Therefore, it is preferred that the lithographic printing plate precursor according to the present invention is provided with a water-soluble surface protective layer comprising a water-soluble high polymer as the main component in order to prevent these accidents. However, the surface protective layer is not essential in the present invention.

Since the water-soluble protective layer is dissolved in a fountain solution and eliminated at the initial stage of printing, no particular labor is required for elimination and the layer does not interfere with printing. The components contained in the water-soluble protective layer are described below.

The water-soluble high polymers contained in the water-soluble protective layer function as a binder in the water-soluble layer. As the water-soluble high polymers, e.g., high polymers having plenty of hydroxyl groups, carboxyl groups and basic nitrogen-containing groups are exemplified.

As the water-soluble high polymers contained in the water-soluble protective layer, specifically, polyvinyl alcohol (PVA), modified PVA, e.g., carboxyl-modified PVA, gum arabic, water-soluble soybean polysaccharide, polyacrylamide, acrylamide copolymers, polyacrylic acid, acrylic acid copolymers, vinyl methyl ether-maleic anhydride copolymers, vinyl acetate-maleic anhydride copolymers, styrene-maleic anhydride copolymers, calcined dextrin, enzyme-decomposed dextrin, enzyme-decomposed etherified dextrin, starch and derivatives thereof, cellulose derivatives, e.g., carboxymethyl cellulose, carboxyethyl cellulose, methyl cellulose, and hydroxyethyl cellulose, casein, gelatin, polyvinyl pyrrolidone, vinyl acetate-crotonic acid copolymers, styrene-maleic acid copolymers, alginic acid and alkaline metallic salts thereof, alkaline earth metallic salts or ammonium salts, polyacrylic acid, poly(ethylene oxide), water-soluble urethane resins, water-soluble polyester resins, polyhydroxyethyl acrylate, polyethylene glycol, polypropylene glycol, and N-vinylcarboxylic acid amide polymers are exemplified. Of these compounds, polyvinyl alcohol (PVA), modified PVA, e.g., carboxyl-modified PVA, gum arabic, polyacrylamide, polyacrylic acid, acrylic acid copolymers, polyvinyl pyrrolidone, alginic acid and alkaline metallic salts thereof are preferably used. Two or more of these water-soluble resins may be used as mixture in the present invention.

The content of these water-soluble resins in a coating solution is generally from 3 to 25%, and preferably from 10 to 25%.

The water-soluble protective layer may contain various kinds surfactants as other component. Anionic surfactants and nonionic surfactants are exemplified as usable surfactants. As the specific examples of surfactants, the same surfactants as those described above for use in the hydrophilic layer are exemplified. The addition amount of surfactants is preferably from 0.01 to 1% based on the total solid contents in the water-soluble layer, and more preferably from 0.05 to 0.5%.

In addition to the above components, if necessary, lower polyhydric alcohols, e.g., glycerol, ethylene glycol and triethylene glycol can be used as a wetting agent. The addition amount of wetting agents is generally from 0.1 to 5.0%, preferably from 0.5 to 3.0%, in the surface protective layer. Antiseptics can further be added to the coating solution of the surface protective layer of the lithographic printing plate precursor according to the present invention. For example, benzoic acid and derivatives thereof, phenol, formaldehyde, sodium dehydroacetate, etc., can be added in an amount of from 0.005 to 2.0%. Defoaming agents can also be added to the coating solution. Organic silicone compounds are preferably used as a defoaming agent in an amount of from 0.0001 to 0.1%.

Further, light-to-heat converting agents can be added to the water-soluble protective layer. In this case, the sensitivity of the hydrophilic layer due to thermal fusion by light irradiation is further heightened, and good results can be obtained. The light-to-heat converting agents described for the hydrophilic layer can be used as a light-to-heat converting agents in the same addition amount.

Coating:

The coating solution prepared by mixing each of the above constitutional components of the hydrophilic layer, heat-insulating layer and protective layer is coated on a support by any of well-known coating methods and dried, thus a printing plate precursor is obtained.

Various well-known coating methods, e.g., bar coater coating, rotary coating, spray coating, curtain coating, dip coating, air knife coating, blade coating, roll coating, etc., can be used.

The dry coating amount of the hydrophilic layer (solid content) is varied according to purpose, but in an ordinary lithographic printing plate precursor, the dry coating amount is preferably from 0.1 to 30 g/$m^2$, and more preferably from 0.3 to 10 g/$m^2$.

The dry coating amount of the heat-insulating layer (solid content) is also varied according to constitution, but in an ordinary lithographic printing plate precursor, the dry coating amount is preferably from 0.1 to 10 g/$m^2$, and more preferably from 0.3 to 5 g/$m^2$. The dry coating amount of the protective layer (solid content) is also varied according to constitution, but in an ordinary lithographic printing plate precursor, the dry coating amount is preferably from 0.1 to 5 g/$m^2$, and more preferably from 0.2 to 3 g/$m^2$. Layers are generally coated in order of the heat-insulating layer, hydrophilic layer and protective layer.

Support:

The supports for use in the lithographic printing plate precursor in the present invention are plate-like materials having dimensional stability, and the supports are not particularly restricted so long as they have required characteristics, e.g., strength, durability and flexibility. For example, paper, papers laminated with plastics (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and papers or plastic films laminated or deposited with the above metals are exemplified as the supports.

Polyester films and aluminum plates are preferably used in the present invention, and aluminum plates are particularly preferred, because they are dimensionally stable and relatively inexpensive.

Preferred aluminum plates are pure aluminum plates and aluminum alloy plates comprising aluminum as a main component and a trace amount of foreign elements. Plastic films laminated or deposited with aluminum may also be used. Foreign elements which may be contained in aluminum alloy are silicon, iron, manganese, copper, magnesium, chromium, zinc, bismuth, nickel, titanium, etc. The content of foreign elements in the aluminum alloy is at most 10% by weight. Particularly preferred aluminum for use in the present invention are pure aluminum but 100% pure aluminum is difficult to produce from the refining technique, accordingly an extremely small amount of foreign elements may be contained. The compositions of aluminum plates for use in the present invention are not specified as described above, and conventionally well-known and commonly used aluminum materials can be used arbitrarily. The aluminum plates for use in the present invention have a thickness of from about 0.1 to about 0.6 mm, preferably from 0.15 to 0.4 mm, and particularly preferably from 0.2 to 0.3 mm.

The aluminum plates which are used as a base material may be subjected to well-known surface treatment, e.g., surface roughening treatment and anodizing treatment.

Further, when other preferred plastic films, e.g., polyester films, are used as a support, it is preferred to use films whose surface on which a hydrophilic layer is formed has been surface-roughened by well-known methods from the viewpoint of formation of the hydrophilic layer and the adhesion of the support with the hydrophilic layer.

Production of Printing Plate:

The lithographic printing plate precursor obtained in this manner is subjected to exposure by well-known methods. In the image-forming mechanism of the lithographic printing plate precursor in the present invention, core-shell structural fine particles form a hydrophobic area by fusing to each other in the area of heating or irradiation with radiation and the hydrophobic area becomes an ink-receiving image area. In the area of non-heating or non-irradiation with radiation, the hydrophilic layer remains as the surface state as it is and the hydrophilic area becomes a non-image area with retaining high hydrophilic property. Accordingly, the lithographic printing plate precursor can be directly mounted on a press and used for printing without undergoing plate making by any simple water development processing or special wet development processing.

The image formation by the lithographic printing plate precursor in the present invention is performed by the application of heat. When a lithographic printing plate precursor using a light-to-heat converting substance is used, an image can be formed by the heat due to scanning exposure with laser beams, etc., in the infrared region.

For image formation, methods such as thermal-fixing, light-fixing, pressure-fixing and solvent-fixing methods are used. Specifically, direct imagewise recording by thermal recording heads, scanning exposure by infrared lasers, high intensity flash exposure by a xenon electric discharge lamp and infrared lamp exposure are used.

For performing direct plate-making by computer-to-plate, fusion by lasers is preferred with a view to improving productivity. Lasers such as gas lasers, e.g., a carbon dioxide laser, a nitrogen laser, an Ar laser, an He/Ne laser, an He/Cd laser and a Kr laser; liquid (dye) lasers; solid state lasers, e.g., a ruby laser and an Nd/YAG laser; semiconductor lasers, e.g., a GaAs/GaAlAs laser and an InGaAs laser; and excimer lasers, e.g., a KrF laser, an XeCl laser, an XeF laser and $Ar_2$ laser can be used. Above all, exposure by semiconductor lasers which radiate infrared rays of the wavelengths of from 700 to 1,200 nm and solid state high output infrared lasers, e.g., a YAG laser, is preferred.

A hydrophobic area by the application of heat and a hydrophilic area maintaining the surface properties of a hydrophilic layer are formed on the hydrophilic layer of a lithographic printing plate precursor which is image-exposed by the above methods, and the printing plate precursor is mounted on a press as it is and can be used for printing according to a usual procedure by feeding ink and a fountain solution. Further, an image can be formed by performing imagewise exposure on a press by mounting a lithographic printing plate precursor on a press equipped with an exposing apparatus.

EXAMPLES

The present invention is illustrated in more detail with reference to examples below, but these are not to be construed as limiting the invention.

Synthesis Example of Organic Hydrophilic Resin:

Into a three-neck flask having a capacity of 500 ml were put 50 g of acrylamide, 3.4 g of mercaptopropyltrimethoxysilane and 220 g of dimethylacetamide, and 0.5 g of 2,2-azobis(2,4-dimethylvaleronitrile) was added to the mixture at 65° C. under nitrogen gas flow. After stirring the reaction mixture for 6 hours with maintaining the same temperature, the temperature was lowered to room temperature. The reaction mixture was put into 2 liters of ethyl acetate, the solid precipitated was filtered and washed with water, thereby an organic hydrophilic resin was obtained. The weight of the resin after drying was 52.4 g. The resin was a polymer having a weight average molecular weight of 3,000 measured by GPC (polystyrene standard), and it was confirmed by $^{13}C$-NMR (DMSO-$d_6$) that the resin was a polymer having the structure represented by the above-exemplified formula I-1 to the terminals of which were introduced trimethoxysilyl groups (50.0 ppm).

Synthesis Examples of Core-Shell Structural Fine Particles and Comparative Fine Particles:

Core-shell structural fine particles and comparative fine particles shown below were synthesized by well-known methods.

Core-Shell Structural Fine Particles (1):

The monomers constituting the core resin: 4-VP/4-MMS/St/DVB (25/35/35/5 in molar ratio)

The particle size of the core fine particles: 66 nm

The monomer constituting the shell: St

The particle size of the core-shell structural fine particles: 90 nm

Core-Shell Structural Fine Particles (2):

The monomers constituting the core resin: 4-HMS/4-MMS/DVB (48/47/5 in molar ratio)

The particle size of the core fine particles: 80 nm

The monomer constituting the shell: MMA

The particle size of the core-shell structural fine particles: 90 nm

Comparative Fine Particles (1):

The monomer constituting the resin: St

The particle size of the fine particles: 80 nm

Comparative Fine Particles (2):

The monomers constituting the resin: 4-VP/4-MMS/St/DVB (25/35/35/5 in molar ratio)

The particle size of the fine particles: 81 nm

The abbreviations for the monomers are as follows:

4-VP: 4-vinylpyridine

4-MMS: 4-methoxymethylstyrene

DVB: divinylbenzene

St: styrene

4-HMS: 4-hydroxymethylstyrene

MMA: methyl methacrylate

Preparation of Lithographic Printing Plate Precursor 1:

Formation of Hydrophilic Layer:

The following components were uniformly mixed and stirred for 2 hours at room temperature to perform hydrolysis, thereby hydrophilic coating solution composition 1 in a sol state was obtained.

Hydrophilic Coating Solution Composition 1:

| | |
|---|---|
| Organic hydrophilic resin (exemplified formula I-1) | 21 g |
| Tetramethoxysilane (crosslinking component) | 62 g |
| Ethanol | 470 g |
| Water | 470 g |
| Nitric acid aqueous solution (1N) | 10 g |

Hydrophilic layer-forming coating solution 1 shown below having an image-forming function was prepared by using this hydrophilic coating solution composition 1, which was coated on a polyethylene terephthalate film support having been subjected to corona discharge treatment in a dry coating amount of 3 g/$m^2$, and the coated layer was dried by heating at 100° C. for 10 minutes and lithographic printing plate precursor 1 was obtained.

Hydrophilic Layer-Forming Coating Solution 1:

| | |
|---|---|
| Hydrophilic coating solution composition 1 | 66 g |
| Core-shell structural fine particles (1) | 400 g |
| Infrared-absorbing dye I | 10 g |
| 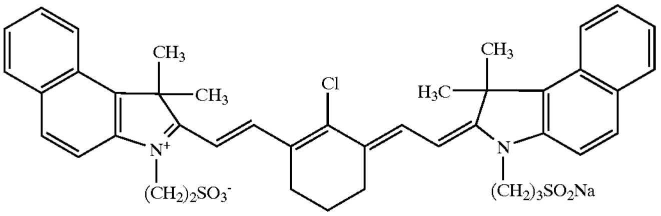 | |
| Water | 374 g |

Preparation of Lithographic Printing Plate Precursor 2:

Lithographic printing plate precursor 2 was prepared in the same manner as in the preparation of lithographic printing plate precursor 1 except for replacing hydrophilic layer-forming coating solution 1 with hydrophilic layer-forming coating solution 2 shown below.

Hydrophilic Layer-Forming Coating Solution 2:

| | |
|---|---|
| Hydrophilic coating solution composition 1 | 66 g |
| Core-shell structural fine particles (2) | 400 g |
| Infrared-absorbing dye I | 10 g |
| Water | 374 g |

Preparation of Lithographic Printing Plate Precursor 3 (Comparison):

Lithographic printing plate precursor 3 was prepared in the same manner as in the preparation of lithographic printing plate precursor 1 except for replacing hydrophilic layer-forming coating solution 1 with hydrophilic layer-forming coating solution 3 shown below.

Hydrophilic Layer-Forming Coating Solution 3:

| | |
|---|---|
| Hydrophilic coating solution composition 1 | 66 g |
| Comparative fine particles (1) | 400 g |
| Infrared-absorbing dye I | 10 g |
| Water | 374 g |

Preparation of Lithographic Printing Plate Precursor 4 (Comparison):

Lithographic printing plate precursor 4 was prepared in the same manner as in the preparation of lithographic printing plate precursor 1 except for replacing hydrophilic layer-forming coating solution 1 with hydrophilic layer-forming coating solution 4 shown below.

Hydrophilic Layer-Forming Coating Solution 4:

| | |
|---|---|
| Hydrophilic coating solution composition 1 | 66 g |
| Comparative fine particles (2) | 400 g |
| Infrared-absorbing dye I | 10 g |
| Water | 374 g |

Examples 1 and 2 and Comparative Examples 1 and 2

The hydrophilic property of the hydrophilic layer before exposure, the forming function of the hydrophobic are a by exposure, the printing property and the scratch resistance were evaluated by the following methods by using each of the above-obtained lithographic printing plate precursors. The results obtained are shown in Table 1 below.

Evaluation Method of Hydrophilic Property of Hydrophilic Layer:

The contact angle (water droplet in air) of the hydrophilic layer surface having an image-forming function on the obtained support was measured with CA-Z (manufactured by Kyowa Kaimen Kagaku Co., Ltd.). The smaller the value of the contact angle, the higher is the hydrophilic property.

Evaluation Method of Formation of Hydrophobic Area:

The obtained lithographic printing plate precursor was subjected to exposure with Trendsetter 3244VFS (manufactured by Creo Co.) mounting a water cooling type 40 W infrared semiconductor laser on the conditions of the rotation speed of the external drum of 100 rpm, the printing plate energy of 200 mJ/$cm^2$, and the resolution of 2,400 dpi, and the contact angle of water droplet in the exposed area was measured and evaluated by the value. The greater the angle of the contact angle, the higher is the hydrophobic property.

Evaluation Method of Printing:

After the obtained lithographic printing plate precursor was subjected to exposure on the same condition as in the above evaluation of formation of hydrophobic area, the lithographic printing plate precursor was mounted on SOR-M printer (manufactured by Heidelberg Co.) without development processing, and printing was performed in a usual manner by using a fountain solution comprising IF201 (2.5%) and IF202 (0.75%) (each manufactured by Fuji Photo Film Co., Ltd.) and GEOS-G sumi (manufactured by Dainippon Chemicals and Ink Co., Ltd.). Printing was evaluated by the number of sheets until good printed matter was obtained (the number of sheets of mackling) and the number of sheets of good printed matters, obtained (the number of sheets of press life).

Evaluation Method of Scratch Resistance:

After the obtained lithographic printing plate precursor was subjected to exposure on the same condition as in the above evaluation of formation of hydrophobic area, the exposed area and the unexposed are a were respectively scratched with a sapphire needle to which a load was applied, and then printing was performed in the same manner as in the above evaluation of printing. Scratch resistance in the exposed area (image area) was evaluated by the load applied to the sapphire needle at the time when blank area (i.e., clear spot) occurred, and that in the unexposed area (non-image area) was evaluated by the load applied to the sapphire needle at the time when scumming occurred.

TABLE 1

| Example No. | Lithographic Printing Plate Precursor | Contact Angle of Water Droplet: Before Exposure (degree) | Contact Angle of Water Droplet: After Exposure (degree) | Evaluation of Printing: Number of Sheets of Mackling | Evaluation of Printing: Number of Sheets of Press Life | Scratch Resistance: Image Area (g) | Scratch Resistance: Non-Image Area (g) |
|---|---|---|---|---|---|---|---|
| Example 1 | 1 | 6.3 | 123 | 10 | 12,000 | more than 300 | more than 300 |
| Example 2 | 2 | 5.8 | 108 | 10 | 12,000 | more than 300 | more than 300 |
| Comparative Example 1 | 3 | 6.1 | 112 | 10 | 8,000 | 10 | more than 300 |
| Comparative Example 2 | 4 | 10 | 120 | 10 | 12,000 | more than 300 | 10 |

As is apparent from the results in Table 1, the lithographic printing plate precursors according to the present invention are highly hydrophilic before exposure and highly hydrophobic after exposure, show a good function of forming a hydrophobic area, and a great number of good printed matters can be obtained with both of the lithographic printing plate precursors. Further, the scratch resistance with both of them was as great as more than 300 g. On the other hand, the lithographic printing plate precursors in comparative examples are highly hydrophilic before exposure and highly hydrophobic after exposure, show a good function of forming a hydrophobic area, and good printed matters can be obtained, but the scratch resistance of the image area of the lithographic printing plate precursor in Comparative Example 1, wherein fine particles not having a functional group capable of interaction are used, is only 10 g, and the scratch resistance of the non-image area of the lithographic printing plate precursor in Comparative Example 2, wherein fine particles having a functional group capable of interaction are used, is only 10 g. From the above results, it is apparently seen that the scratch resistance in both image area and non-image area can be improved by using the core-shell structural fine particles according to the present invention.

Example 3

A 1050 aluminum plate having a thickness of 0.30 mm was degreased by washing with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$.

The aluminum plate was then anodized with a 7% sulfuric acid aqueous solution as the electrolytic solution by electric density of 15 $A/dm^2$ to obtain an anodic oxide film having a thickness of 2.4 $g/m^2$ by direct current. The plate was then washed with water and dried, thereby a support was obtained.

The same hydrophilic layer-forming coating solution 1 having an image-forming function as used in Example 1 was coated on the above aluminum support in a dry coating amount of 3 $g/m^2$, and the coated layer was dried by heating at 100° C. for 10 minutes and lithographic printing plate precursor 5 was obtained. The contact angle (water droplet in air) of the hydrophilic layer surface on the obtained support measured in the same manner as in Example 1 was 6.5° and it was confirmed that the hydrophilic layer had excellent hydrophilic property.

Lithographic printing plate precursor 5 was subjected to exposure with Trendsetter 3244VFS (manufactured by Creo Co.) on the same conditions as above. The contact angle of water droplet in the exposed area was 120°, from which it was confirmed that a hydrophobic area was formed. The results of the evaluation of the scratch resistance of the image area and the non-image area of the exposed printing plate were both higher than 300 g, which proved that the printing plate had good scratch resistance. The number of sheets of mackling of the lithographic printing plate was 10 sheets and the number of sheets of good printed matters obtained was 12,000 sheets. From these results, it was confirmed that the printing plate had good-printing performance.

EFFECT OF THE INVENTION

The present invention can provide a lithographic printing plate precursor capable of being mounted directly on a press for use for printing with no treatment after scanning exposure based on digital signals, excellent in maintaining high hydrophilic property, capable of providing a great number of good printed matters, and further excellent in the scratch-resistance of a non-image area and an image area.

The entitle disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a support having provided thereon a hydrophilic layer which is converted to hydrophobic by heating, wherein the hydrophilic layer contains (1) an organic and inorganic composite having a crosslinking structure obtained by hydrolysis and polycondensation on condition of coexistence of a metal complex compound and an organic hydrophilic resin, and (2) core-shell structural fine particles containing a resin core having a functional group capable of interacting with the organic and inorganic composite and a resin shell not substantially having a functional group capable of interacting with the organic and inorganic composite.

2. The lithographic printing plate precursor as in claim 1, wherein the metal complex compound is at least one alkoxide of metal selected from the group consisting of Si, Ti, Zr and Al.

3. The lithographic printing plate precursor as in claim 1, wherein the organic and inorganic composite has a hydrophilic graft chain.

* * * * *